United States Patent

Antol et al.

(10) Patent No.: US 7,727,781 B2
(45) Date of Patent: Jun. 1, 2010

(54) MANUFACTURE OF DEVICES INCLUDING SOLDER BUMPS

(75) Inventors: Joze Eura Antol, Hamburg, PA (US);
Kishor V. Desai, Fremont, CA (US);
John William Osenbach, Kutztown, PA (US); Brian Thomas Vaccaro, Mertztown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/220,182

(22) Filed: Jul. 22, 2008

(65) Prior Publication Data

US 2010/0022034 A1 Jan. 28, 2010

(51) Int. Cl.
*G01L 31/26* (2006.01)
*H01L 21/66* (2006.01)

(52) U.S. Cl. ............. 438/14; 438/15; 438/106; 438/612

(58) Field of Classification Search ............ 438/14, 438/15, 17, 106–110, 612–617
See application file for complete search history.

(56) References Cited

U.S. PATENT DOCUMENTS

| | | | | |
|---|---|---|---|---|
| 6,294,397 B1 * | 9/2001 | Jarvis et al. | | 438/17 |
| 6,415,974 B2 * | 7/2002 | Jao | | 228/215 |
| 6,787,918 B1 * | 9/2004 | Tsai et al. | | 257/778 |
| 6,960,836 B2 * | 11/2005 | Bachman et al. | | 257/763 |
| 2006/0231835 A1 * | 10/2006 | Choi et al. | | 257/48 |
| 2008/0136018 A1 * | 6/2008 | Kato et al. | | 257/737 |

* cited by examiner

*Primary Examiner*—Charles D Garber
*Assistant Examiner*—Bryan R Junge
(74) *Attorney, Agent, or Firm*—Mendelsohn, Drucker & Associates, P.C.; Steve Mendelsohn

(57) ABSTRACT

Typical testing of solder joints, (e.g. joints at printed circuit board pads) has not proven totally predictive of the ultimate performance of such joints. It has been found that this lack of reliability is, at least in part, due to the tendency during testing for these pads to lose adhesion to, or delaminate from, the underlying substrate. In contrast, such occurrence is not typical of phenomena induced during typical device usage. To remove this source of unreliability, a test structure is made together with the manufacturing device lot. The same pad processing is used and the pad size is substantially enlarged in the test structure. The test structure is employed to predict performance of devices in the lot and then the lot is processed accordingly.

3 Claims, 2 Drawing Sheets

MANUFACTURE OF DEVICES INCLUDING SOLDER BUMPS

TECHNICAL FIELD

This invention relates to the manufacture of electronic devices and more particularly the manufacture of electronic devices including solder joints.

BACKGROUND OF THE INVENTION

The electronic instrumentalities forming the basis for equipment such as mobile phones, computers, and servers are generally fabricated by electrically interconnecting electronic components such as integrated circuits, resistors and capacitors with printed circuit boards. The electrical input and output of the components to a second component, for example, a printed circuit board is generally accomplished through a conducting region typically denominated a pad. Such pads generally have dimensions in the range 100 $\mu m^2$ to 1 $mm^2$ and are electrically connected to the circuitry of the component such as a printed circuit board through conducting pathways denominated runners. (A runner typically has a width in the range 5 $\mu m$ to 100 $\mu m$ and a length, depending on the device configuration, often ranging between a few micrometers and a few centimeters.) For most applications, both the pad and runner, on, for example, the printed circuit board, are metallic and have upper surfaces that include copper, nickel, gold, silver, palladium, or aluminum. (Upper in the context of this disclosure is a surface closest to the point of electrical connection to another component.)

Two components, e.g. an integrated circuit and printed circuit board, are electrically connected through the expedient of solder ball connections, or as they are termed in the trade, solder bump or solder ball connections. Typically, the pads of the two components to be electrically interconnected are, at least in part, configured to be geometrically aligned when the components are positioned for connection. The electrical connection itself in many applications such as flip chip solder connection is made by first forming a solder bump on one (e.g. the integrated circuit pad) of each pair of pads to be electrically connected. (The solder bump is typically approximately spherical in cross section but the shape is not critical.) In manufacture, a solder mask composed generally of an electrically insulating material is configured over the pad region of, for example, the printed circuit board with openings in the mask to allow connection to the underlying pads. (See *Microelectronic Packaging Handbook*, R. Tummala, et. al., Chapman and Hall, New York, N.Y. 1997, for a description of typical solder mask materials and methods for configuring such masks.) The components are then electrically connected by a process (generally denominated reflow) in which the pads to be connected are aligned and the solder bumps are brought to a temperature exceeding their melting point as described by Tummala supra. This heating process causes the formation of intermetallic compounds at the solder bump/pad interface that contribute to the adhesion of the connected structure. For example, for a copper pad and a lead-free tin/silver/copper solder composition typical intermetallic compounds such as $Cu_6Sn_5$ and $Cu_3Sn$ respectively are formed at the interface. Similar intermetallics are formed when tin/silver/copper solder balls are attached to the copper pads on a circuit board during reflow.

For reasons that are not fully understood, solder bumps (or solder balls) at times fail when subjected to stress engendered by typical occurrences such as the dropping of an instrumentality or a component, or through the mechanical forces endured during transportation and handling of such entities. There are two predominant failure modes for the solder bump connection. Either the solder bump itself shears into two portions, or the bump fractures (brittle failure) near or at the intermetallic region present at the interface between the pad and the solder bump. Clearly the failure of the electrical connection, especially after the instrumentality has been assembled, is costly and quite undesirable.

In an attempt to predict the failure of components and remove such components from the manufacturing stream, a variety of tests have been developed. In one approach, a probe, 2 in FIG. 1, is traversed in direction 5 against solder bump 7 present on pad 9 with surrounding solder mask 6. The speed of the probe traversal has a significant effect on the ultimate results. Generally, faster probe speeds, i.e. speeds in excess of 1 mm/sec, lead to brittle failure i.e. failure at the intermetallic compound present at the interface from solder bump formation and/or reflow. Slower speeds, i.e. speeds less than 0.5 mm/sec, typically lead to ductile failure—a sheering of the solder bump bulk. (Speeds between 0.5 mm/sec and 1 mm/sec lead to a mixed failure mode.) Similarly, in a second approach to testing, as shown in FIG. 2, the solder bump 7 is grasped by probe 20 and stress is applied in direction 25. Again, the speed of the probe movement dictates whether a brittle or ductile failure occurs.

The failure of solder bumps has become an even more pressing problem with the ever increasing desire to eliminate lead from solder bump compositions. Lead-containing solders are more prone to undergo ductile failure than lead-free solder alloys. In contrast, lead-free solders i.e. solders having a lead content less than 300 ppm lead, have an increased tendency to suffer brittle rather than ductile failure. Unfortunately, a composition that predominantly fails by a ductile mechanism is much preferred because such failure typically occurs less frequently and occurs only after substantially longer periods of stress. Thus, the trend towards lead-free solders has made the identification of components that are likely to fail a more pressing concern. Despite the ever-increasing importance of such identification, available testing approaches have not yielded the desired level of predictability.

SUMMARY OF THE INVENTION

It has been found that probe testing of solder connections causes not only stress to the solder bump but also to the underlying connection between 1) the pad and runner and 2) the supporting substrate. Thus the applicants have found during testing a tendency towards a weakening or complete delamination of the pad/substrate interface. In contrast such structure weakening or delamination does not occur for typical stress associated with handling, transport, or dropping of the device. As a result, any conclusions relative to the solder bump integrity drawn from testing is unreliable. The reliability of testing in accordance with the invention is substantially enhanced by employing a test structure manufactured with the devices to be tested in the normal manufacturing stream. This test structure, however, does not employ the same pad and runner configuration as in the manufactured devices. In particular, the test structure has a pad upon which the solder bump is ultimately formed that has a specific surface area relative to the opening in the solder mask that confines the solder bump. That is, the pad should, at every point along the periphery of the solder mask opening, extend under the solder mask, beyond the periphery of the solder mask opening a distance that is at least as long as half the solder mask opening primary dimension. (The solder mask opening primary dimension is equal to the diameter of a circle having the same area as defined by the region of the pad left uncovered by mask material at the solder mask opening.)

Additionally, the test structure should include all material layers in the manufactured device that contribute to formation of the intermetallic compound (IMC) at the solder pad interface plus one additional layer below such IMC provided such additional layer has a metallic composition. (Below, in the context of this invention, is in a direction towards the substrate upon which the pad is formed.)

After solder formation and generally before further processing of the corresponding manufacturing lot the test structure is subjected to the test probe as previously described. Since the test structure has the same characteristic mechanical attributes as the device being manufactured and since the additional pad material prevents weakening of the pad/substrate interface, an enhanced reliability in the prediction of solder bump failure is achieved even for lead-free solder composition. The results on the test structure are employed to determine whether the device that is being manufactured should be completed or whether modification to such devices is required before completion to avoid solder joint failure.

DETAILED DESCRIPTION

Figure 1:
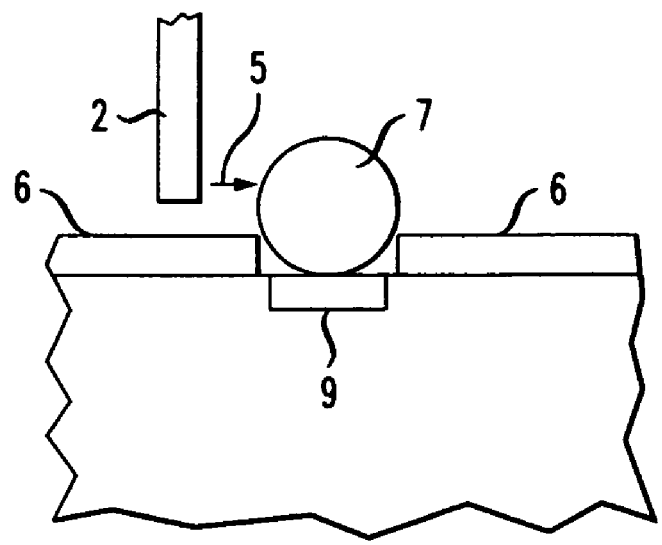
FIGS. 1 and 2 are indicative of tests used to measure solder bump reliability.
Figure 2:
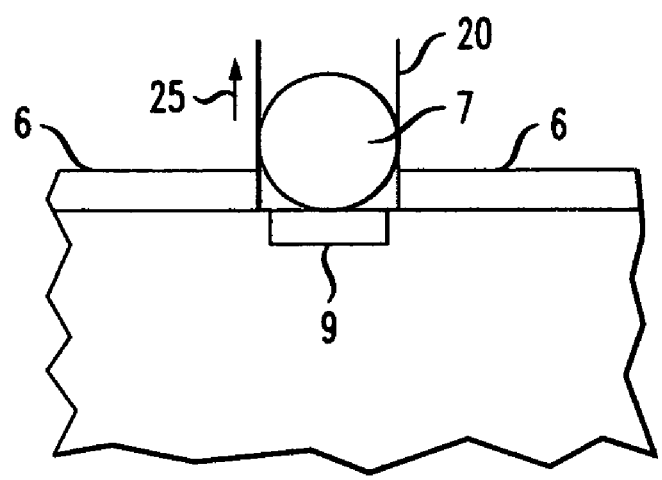
Figure 3:
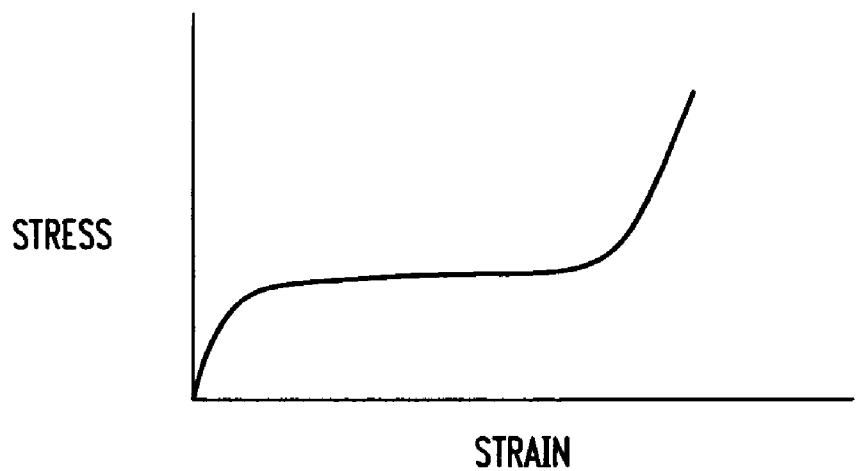
FIG. 3 is illustrative of a stress versus strain behavior.

As discussed, the invention involves the use of a test structure formed together with devices being manufactured. After solder bump formation on the devices being manufactured and on the test structure, such structure is probed. For example, as shown in FIG. 1, a probe moving at a speed in the range 0.5 mm/sec to 5 mm/sec is employed to stress the solder joint. Alternatively a probe such as shown in FIG. 2 is moved in traversal direction 25 at a speed in the range 0.5 mm/sec to 5 mm/sec. The strain induced in solder joint 7 for either configuration is measured using a strain gauge. An illustrative plot of stress versus strain so measured is shown in FIG. 3. The exact strain energy that leads to failure is of less importance than the failure mode. The failure mode is defined as either completely ductile (in the solder), completely brittle (in or at the intermetallic interface), or mixed (ductile-brittle). Joints that fail in brittle or mixed mode (where the percentage of the joint failing in a brittle mode is greater than 25%) are considered problematic.

If unacceptable results are indicated by the test structure, remedial action is performed on the devices being manufactured. Remedial action includes, for example, elimination of the manufactured lot, or alternatively treating some or all of the manufactured devices to improve the solder bump structure. Suitable treatments include processes such as subjecting the lot to a drop of 1 meter and removing any components in which at least one solder joint is no longer viable after dropping. If the lot is treated, as opposed to eliminated, the lot undergoes continued processing through the manufacturing process. Accordingly, devices whose accompanying test structure pass testing, or devices after a negative test that have been treated to improve solder bump performance or to eliminate unacceptable joints are used for electrical connection to another component. Thus, if the solder bumps are present on an integrated circuit, such integrated circuit is mated for example, to corresponding pads on a printed circuit board.

Although it is acceptable to use one test structure for a manufacturing lot, a multiplicity of such test structures for a lot is employable. In such case, all or a portion of the test structures are subjected to probing and the lot is either processed or a remedial action is taken based on the results of such testing.

Figure 4:
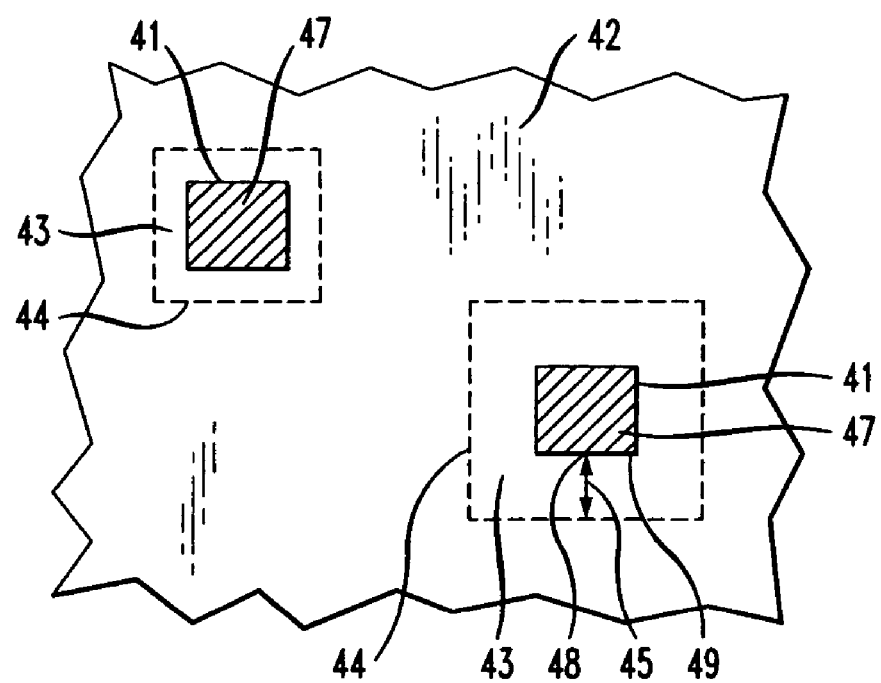
FIG. 4 is illustrative of test structures in accordance with the invention.

As previously discussed, a test structure or structures are formed along with a manufacturing lot of devices. During such manufacture, pads and runners are formed for the devices and an overlying soldering mask is structured with openings exposing the underlying pads. The test structures are similarly formed except the runner configuration is not required (although could be present) and instead the pads are sized to prevent delamination or other compromise. As shown in FIG. 4, (which is a plan view of a section of a component with solder mask openings 41), pads 43 delineated by dotted lines 44 underlie solder mask 42. The distance 45 from the periphery of the solder mask opening to the periphery of the pad along at least 50 percent of the perimeter of the solder mask opening should be at least one half the primary dimension of such opening. (The primary dimension of a solder mask opening is the diameter of a circle whose area is the same as the area of the pad exposed by the solder mask opening, i.e. the shaded region 47 in FIG. 4. The distance 45 measured at any point 48 along the perimeter 49 of the solder mask opening is measured perpendicular to a tangent to such point 48.) Although these extended pads 43 need not be connected it is acceptable that connections and even a continuous metal layer be present. The composition of the pad in the test structures should be essentially the same as that in the devices being manufactured.

After the pads are formed manufacture typically continues with regions added to the pad to facilitate adhesion of the solder bump. For example, in one common approach (denominated ENIG), sequential layers of electroless plated nickel followed by electroless plated immersion gold are formed. (Such processes have become common in the trade and are described in *Electroless Nickel Plating*, W. Reidel, ASM International, Metal Park, Ohio, 1998. Similarly, another approach (denominated ENEPIG) involves the sequential formation of regions by electroless nickel plating, electroless palladium plating, followed by autocatalytic plating of gold. (This alternate approach is also common in the trade and is described in "Study of Ni—P/Pd/Au as a Final Finish for Packaging," S. Hashimoto et. al., IMAPS, (International Microelectronics and Packaging Society) 2006.) After the surface treatment for the pad is provided, generally a solder mask is applied and openings over the pad are formed by photodelineation processes. (See Tummala et. al. supra for a description of typical solder mask compositions and processes for their photodelineation.) A solder bump (or solder ball) is then formed on desired pads exposed by solder mask delineation. (Solder bump formation is described in *Low Cost Flip Chip Technologies*, J. Lau, McGraw-Hill, New York, N.Y., 2000 and solder ball attachment is described in Tummala et. al supra.)

To form electrical connection between two components e.g. an integrated circuit and a printed circuit board, a reflow process is generally employed. For reflow the structure is subjected to a temperature that is generally ramped at a rate of 0.5 to 10 degrees C. per sec to a temperature in the range 185 to 225 degrees C. for lead containing solders such as a eutectic lead/tin solder and 235 to 260 degrees C. for lead-free solders. The temperature is held in such range for a time period in the range 30 to 120 sec and then generally lowered at a rate in the range 0.5 to 5 degrees C. per sec. For lead-free solders, it is generally desirable to repeat this reflow process using the same range of parameters.

As previously discussed, the reflow process along with solder bump formation induces formation of an intermetallic compound and involves the chemical interaction of the solder composition with one or more of the layers present above the pad and possibly with the composition of the pad itself. The test structure should be manufactured so that the same layers overlying the pad are present in the test structure as compared to the devices being manufactured so that essentially the same intermetallic compound is formed. For example, the test structure pads are treated in precisely the same manufacturing lot as the devices being manufactured to form the layers overlying the pads. Additionally, at least one metal layer below those involved in intermetallic compound formation should have essentially the same composition in the test structure as in the devices being manufactured. (If in the manufacturing device there is no metal region underlying the layers involved in intermetallic compound formation, then this requirement of an additional metal region is not necessary.) In an advantageous approach the test structure after pad formation is processed along with the devices being manufactured in exactly the same manner.

The invention claimed is:

1. A method for manufacturing an integrated device and a test structure for characterizing properties of the integrated device, the method comprising:
   (a) manufacturing the integrated device comprising (i) a substrate, (ii) a pad having a periphery, the pad overlying the substrate to form a pad-substrate interface, (iii) a solder mask overlying the substrate, the solder mask having an opening with a periphery, wherein the periphery of the pad is within the periphery of the opening, and (iv) a solder bump attached to the pad to form a solder-pad interface; and
   (b) manufacturing the test structure comprising (i) a substrate, (ii) a pad corresponding to the pad of the integrated device and having a periphery, the pad overlying the substrate to form a pad-substrate interface, (iii) a solder mask overlying the substrate, the solder mask having an opening with a periphery, wherein the periphery of the pad extends below the solder mask and beyond the periphery of the opening, and (iv) a solder bump attached to the pad, wherein:
   extending the periphery of the pad of the test structure below the solder mask and beyond the periphery of the opening strengthens the pad-substrate interface of the pad of the test structure compared to the pad-substrate interface of the pad of integrated device; and
   the integrated device and the test structure are part of a single manufacturing lot.

2. The method of claim 1, further comprising:
   (c) performing testing on the solder bump of the test device to characterize properties of the solder-pad interface of the integrated device.

3. The method of claim 2, wherein the testing includes stress testing.

* * * * *